United States Patent
Salem et al.

(10) Patent No.: US 8,914,760 B2
(45) Date of Patent: Dec. 16, 2014

(54) ELECTRICAL HOTSPOT DETECTION, ANALYSIS AND CORRECTION

(71) Applicant: Mentor Graphics Corporation, Wilsonville, OR (US)

(72) Inventors: Rami Fathy Salem, Windsor (CA); Haitham Mohamed Eissa, Cairo (EG); Ahmed Arafa, Milpitas, CA (US); Sherif Hany Mousa, Cairo (EG); Abdelrahman ElMously, Wilsonville, OR (US); Walid Farouk Mohamed, Cairo (EG); Mohamed Amin Dessouky, Cairo (EG)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

(21) Appl. No.: 13/627,933

(22) Filed: Sep. 26, 2012

(65) Prior Publication Data

US 2014/0089877 A1  Mar. 27, 2014

Related U.S. Application Data

(60) Provisional application No. 61/644,788, filed on May 9, 2012.

(51) Int. Cl.
*G06F 17/50* (2006.01)

(52) U.S. Cl.
CPC ........ *G06F 17/5081* (2013.01); *G06F 17/5063* (2013.01)
USPC ................ 716/112; 716/53; 716/54; 716/55; 716/56; 703/14

(58) Field of Classification Search
CPC ........................ G06F 17/5081; G06F 17/5063
USPC ..................... 716/52, 53, 54, 55, 112; 703/14
See application file for complete search history.

(56) References Cited

U.S. PATENT DOCUMENTS

| | | | | |
|---|---|---|---|---|
| 6,083,275 A | * | 7/2000 | Heng et al. | 716/52 |
| 7,725,845 B1 | * | 5/2010 | White et al. | 716/132 |
| 7,784,019 B1 | * | 8/2010 | Zach | 716/53 |
| 8,584,072 B1 | * | 11/2013 | Gopalakrishnan et al. | 716/132 |
| 8,612,921 B1 | * | 12/2013 | Gopalakrishnan et al. | 716/136 |
| 2009/0300561 A1 | * | 12/2009 | Tong et al. | 716/5 |
| 2012/0054694 A1 | * | 3/2012 | Hamouda | 716/53 |

* cited by examiner

*Primary Examiner* — Phallaka Kik
(74) *Attorney, Agent, or Firm* — Klarquist Sparkman, LLP

(57) ABSTRACT

Aspects of the invention relate to techniques for detecting and correcting electrical hotspots in a layout design for a circuit design comprising an analog circuit. Layout parameters for device instances associated with electrical constraints are first extracted. Based on the extracted layout parameters, electrical parameter variations for the device instances may be computed to identify one or more electrical hotspots in the layout design. A sensitivity analysis of the one or more electrical hotspots is performed to generate repair hints. Based on the repair hints, the layout design is adjusted.

28 Claims, 7 Drawing Sheets

ELECTRICAL HOTSPOT DETECTION, ANALYSIS AND CORRECTION

RELATED APPLICATIONS

This application claims priority to U.S. Provisional Patent Application No. 61/644,788, entitled "A Parametric DFM Solution For Analog Circuits: Electrical Driven Hot Spot Detection, Analysis And Correction Flow," filed on May 9, 2012, and naming Rami Fathy Salem et al. as inventors, which application is incorporated entirely herein by reference.

FIELD OF THE INVENTION

The present invention relates to the field of integrated circuit (IC) design and process technology. Various implementations of the invention may be particularly useful for detecting and correcting electrical hotspots.

BACKGROUND OF THE INVENTION

The design for manufacturing (DFM) aims to reduce defects that occur during manufacturing, which in turn results in fewer design returns and shorter production cycles, hence lowering total product costs. Therefore, it is important to understand the source of yield issues. Most early DFM efforts concentrated on catastrophic failures such as bridging faults, or physical DFM problems. Recently, there has been an increased emphasis on identifying and analyzing parametric yield issues caused by manufacturing process variation, commonly referred to as electrical DFM (e-DFM). This is because at the technology node of 90 nm, parametric failures become significant, and at 65 nm, parametric failures become the single most critical yield-limiting factor. Existing DFM solutions focus on analyzing and detecting electrical variations mainly for digital designs. There is a need for DFM tools for analog and mixed-signal designs.

A typical analog design flow is divided into two phases: front-end phase and back-end phase. In the front-end phase, circuit designers create schematics needed to build the circuit. One of the major tasks is to place transistors with certain widths and lengths in the schematics. Transistor-level simulation tools such as SPICE simulation tools are used in this phase to verify circuit performance. To check the schematics against potential process variations, extensive simulation runs are performed.

The schematics designers then pass the design to layout designers in the back-end phase, along with some layout constraints, e.g., which transistors need to be matched, where the differential pairs are located, etc. Electrical devices and their instances in the schematics are translated into physical layout features. Using physical verification tools, layout designers then verify that the layout design complies with the design technology rules for fabrication, and that the layout matches the schematics. A parasitic extraction (PEX) may also be back-annotated to the netlist to run post-layout simulations. A netlist is a form of a circuit design. A schematic netlist is created by circuit designers while a layout netlist may be extracted from a layout using conventional LVS (layout-vs-schematic) tools.

The current design process essentially consists of a series of trial and error cycles. These cycles are highly computationally expensive, especially in the analog and mixed-signal flow, where there are multiple design corners to be covered.

Various analog devices, such as current mirrors, differential pairs, and amplifiers, are sensitive to physical layout effects. Lithography variations, for example, can have a significant impact on device dimensions such as length (L), width (W), area drain capacitance (AD), and area source capacitance (AS). Shallow trench isolation (STI) in the CMOS process may induce mechanical stresses on the transistor channel. These mechanical stresses alter the transistor channel mobility ($\mu$) and voltage threshold (Vth). In technology nodes at 65 nm and below, geometrical and electrical parameters of a transistor are also affected by its neighboring devices in the layout design. This is sometimes referred to as proximity effects. All these physical layout effects cause deviations in electrical performance of transistors and subsequently in the circuit target specifications. If the electrical performance variations exceed electrical constraints set by, for example, front-end designers, the corresponding layout features are regarded as electrical hotspots.

To improve the manufacturing yield, electrical hotspots should be corrected before a design is taped-out. There are, however, no conventional tools for improving circuit designs that include analog designs by detecting, analyzing and correcting electrical hotspots automatically.

BRIEF SUMMARY OF THE INVENTION

Aspects of the invention relate to techniques for electrical hotspot detection and correction. The electrical hotspot detection and correction is based on information of electrical constraints for a circuit design set by, for example, front-end designers. The circuit design comprises one or more analog circuits. The electrical constraints are associated with electrical devices employed by the circuit design. Device instances of the electrical devices are linked to corresponding geometric features in a layout design for the circuit.

According to various implementations of the invention, layout parameters for the device instances are extracted. The layout parameters may comprise context-aware stress parameters, lithography-aware dimension parameters, or both.

Based on the extracted layout parameters, electrical parameter variations for the device instances may be computed to identify one or more electrical hotspots in the layout design. The computation may be based directly on device model equations or on simulation. The computed electrical parameter variations may be compared with the electrical constraints to identify electrical hotspots.

A sensitivity analysis of the one or more electrical hotspots is performed to generate repair hints. The sensitivity analysis may comprise mechanical stress effect analysis, lithography variation effect analysis, layout proximity effect analysis, or any combinations thereof.

Based on the repair hints, the layout design is adjusted. The adjustment may employ a smart cost-function technique.

DETAILED DESCRIPTION OF THE INVENTION

General Considerations

Figure 1:
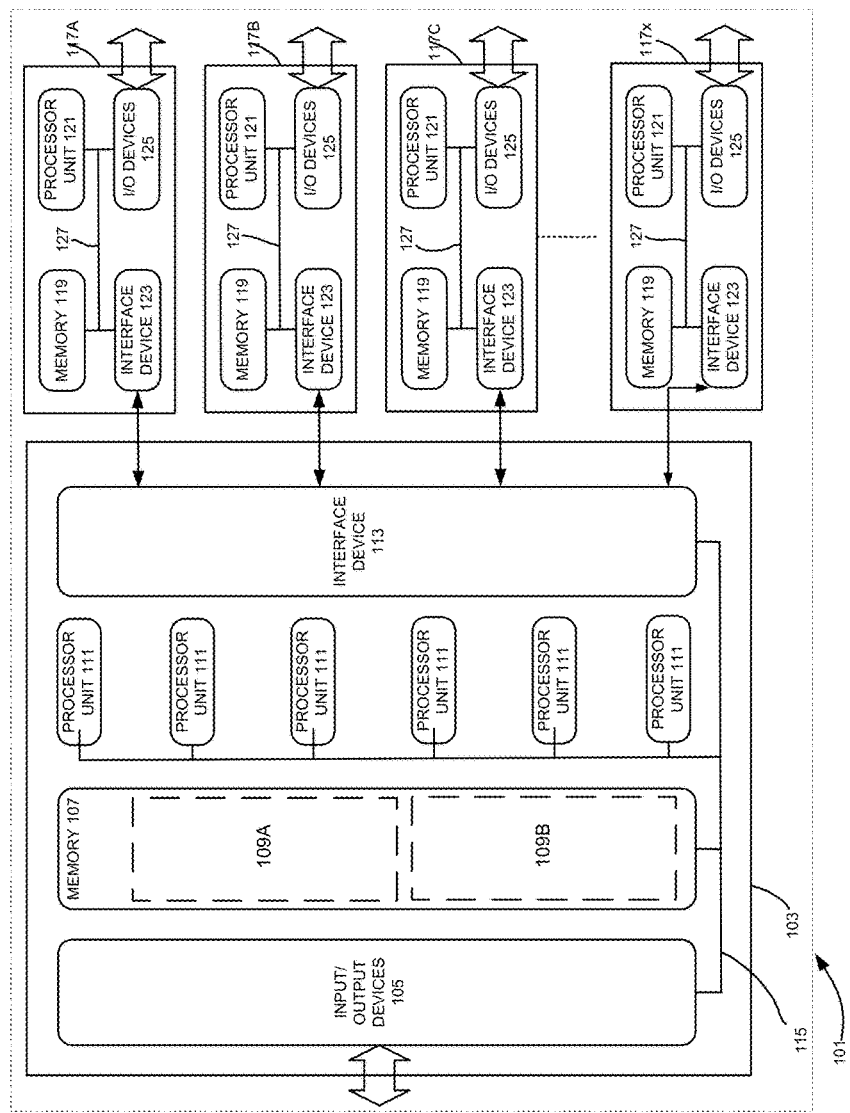
FIG. 1 illustrates an example of a computing system that may be used to implement various embodiments of the invention.

Various aspects of the present invention relate to detecting and correcting electrical hotspots on layout designs. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform," "link," "compute" and "extract" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
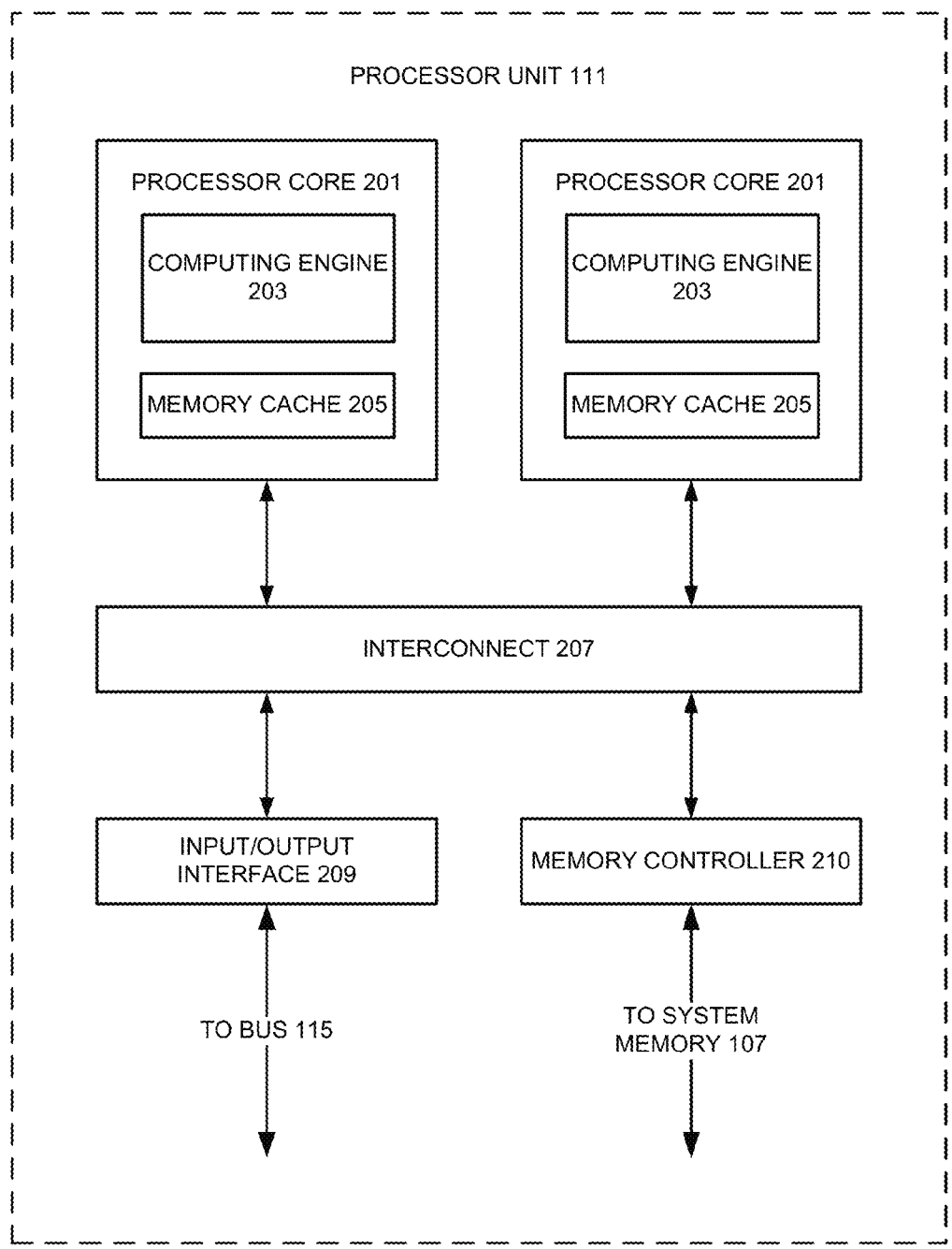
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 210. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Electrical DFM Tools and Methods

Figure 3:
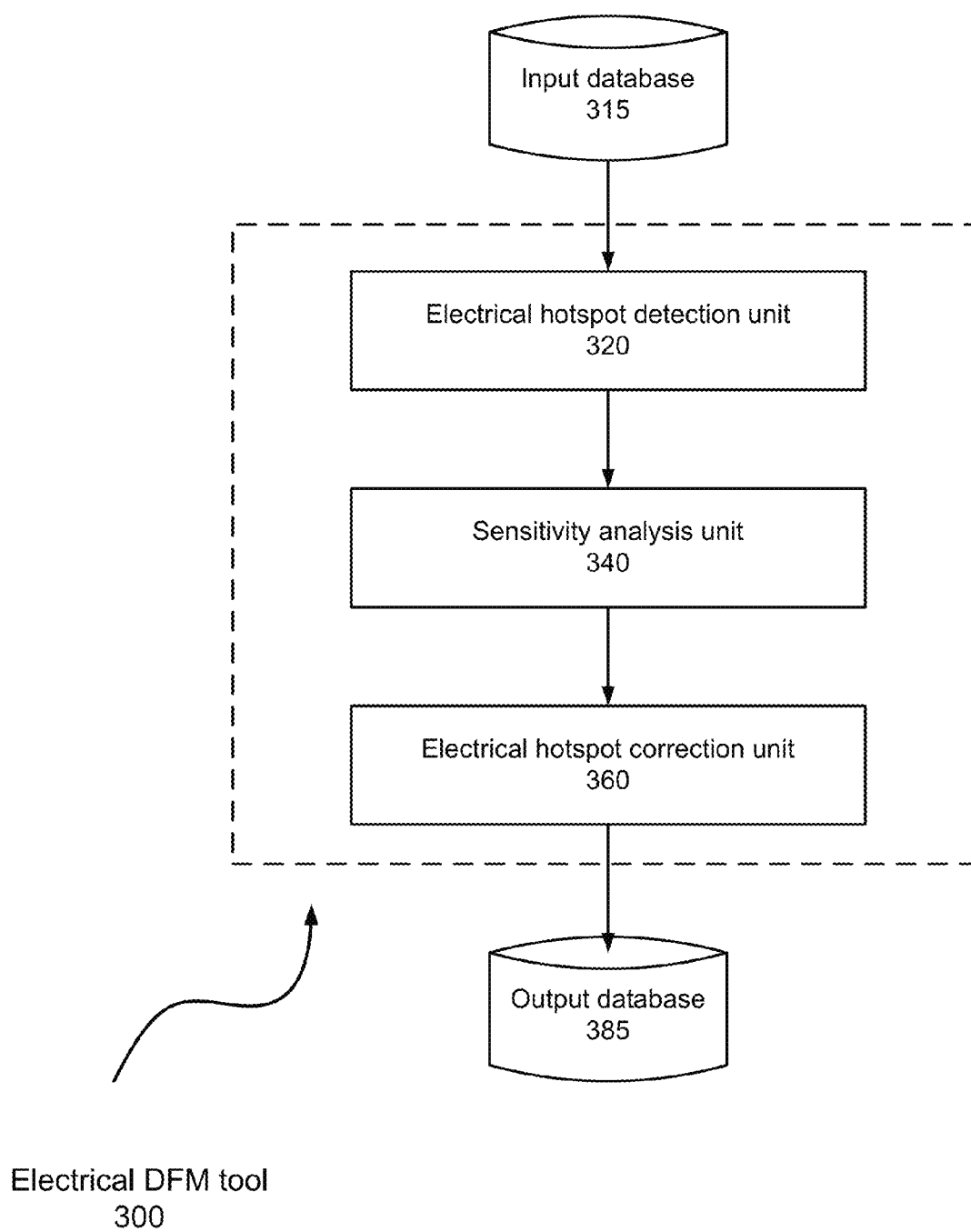
FIG. 3 illustrates an electrical DFM tool that may be employed according to various embodiments of the invention.

FIG. 3 illustrates an example of an electric DFM tool according to various embodiments of the invention. As seen in the figure, the electric DFM tool 300 includes three units: an electrical hotspot detection unit 320, a sensitivity analysis unit 340, and an electrical hotspot correction unit 360. As will be discussed in more detail below, some implementations of the electric DFM tool 300 may cooperate with (or incorporate) one or both of an input database 315 and an output database 385. While the input database 315 and the output database 385 are shown as separate units in FIG. 3, a single data storage medium may be used to implement some or all of these databases.

According to some embodiments of the invention, one or more of the electrical hotspot detection unit 320, the sensitivity analysis unit 340, and the electrical hotspot correction unit 360 may be implemented by executing programming instructions on one or more programmable computers/computer systems, such as the computing system illustrated in FIG. 1 and FIG. 2. Correspondingly, some other embodiments of the invention may be implemented by software instructions, stored on a non-transitory computer-readable medium (computer-readable storage medium), for instructing one or more programmable computers/computer systems to perform the functions of one or more of the electrical hotspot detection unit 320, the sensitivity analysis unit 340, and the electrical hotspot correction unit 360. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 4:
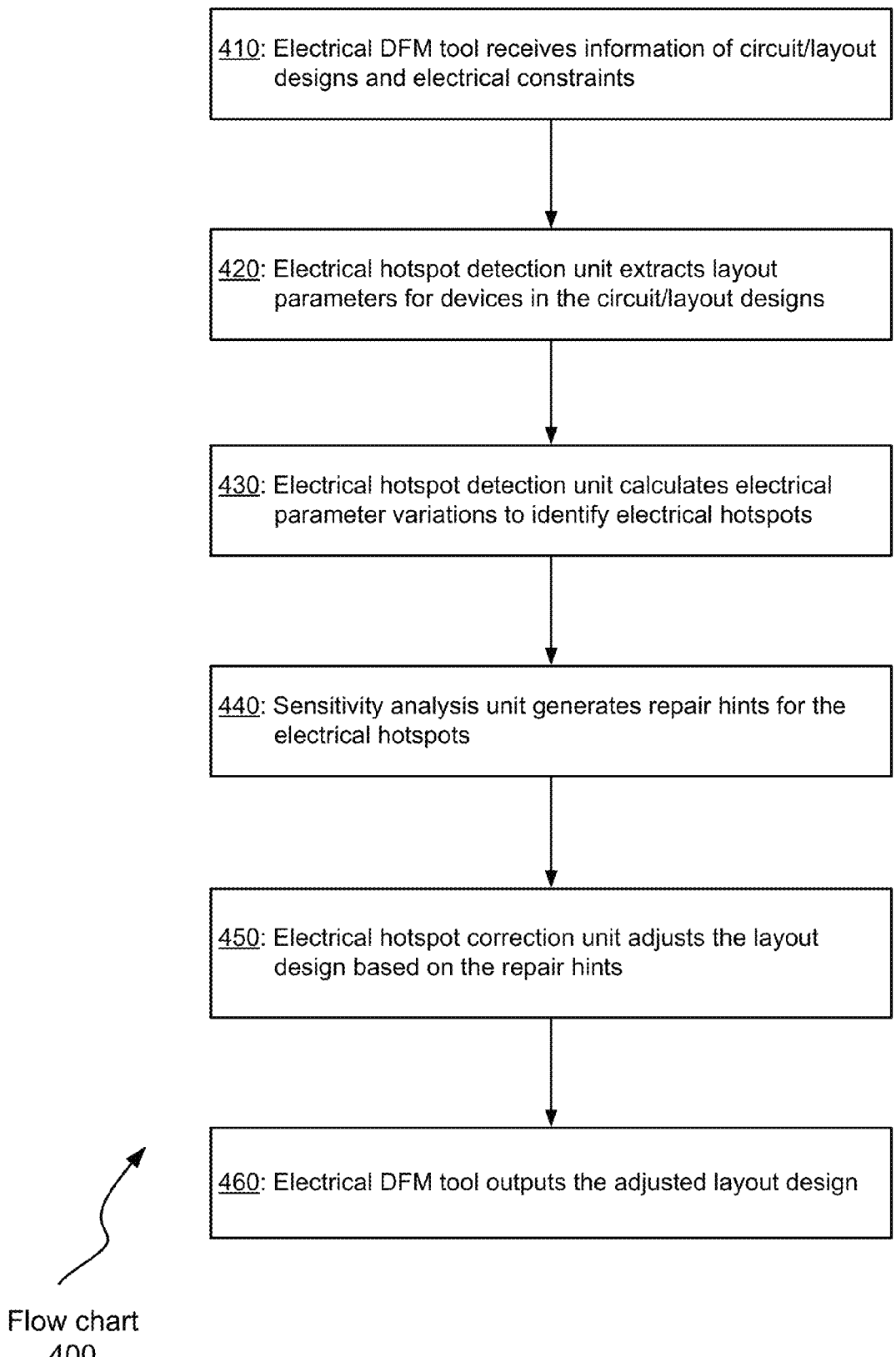
FIG. 4 illustrates a flowchart describing methods for electrical hotspot detection and correction that may be employed by various embodiments of the invention.

For ease of understanding, electrical hotspot detection and correction methods that may be employed according to various embodiments of the invention will be described with reference to the electric DFM tool 300 illustrated in FIG. 3 and the electrical hotspot detection and correction method shown in the flow chart 400 in FIG. 4. It should be appreciated, however, that alternate implementations of an electric DFM tool may be used to perform the electrical hotspot detection and correction method shown in the flow chart 400 according to various embodiments of the invention. In addition, it should be appreciated that implementations of the electric DFM tool 300 may be employed with other methods for electrical hotspot detection and correction according to different embodiments of the invention.

Initially, in operation 410 of the flowchart 400, the electric DFM tool 300 receives information of a circuit design and a layout design for an integrated circuit, and information of electrical constraints. The integrated circuit, comprising one or more analog circuits, is either an analog circuit or a mixed-signal circuit. The electrical constraints are associated with one or more electrical devices employed by the integrated circuit and may define the electrical behavior of these devices. For example, an electrical constraint may stipulate that the two transistors in a differential pairs should be matched in gate length within 5% tolerance. A certain device may appear in multiple locations in the integrated circuit, each appearance being referred to as a device instance. The device instances of the one or more electrical devices in the circuit design are linked to corresponding geometric features in the layout design. The circuit design may comprise a transistor-level netlist such as a SPICE netlist.

Figure 5:
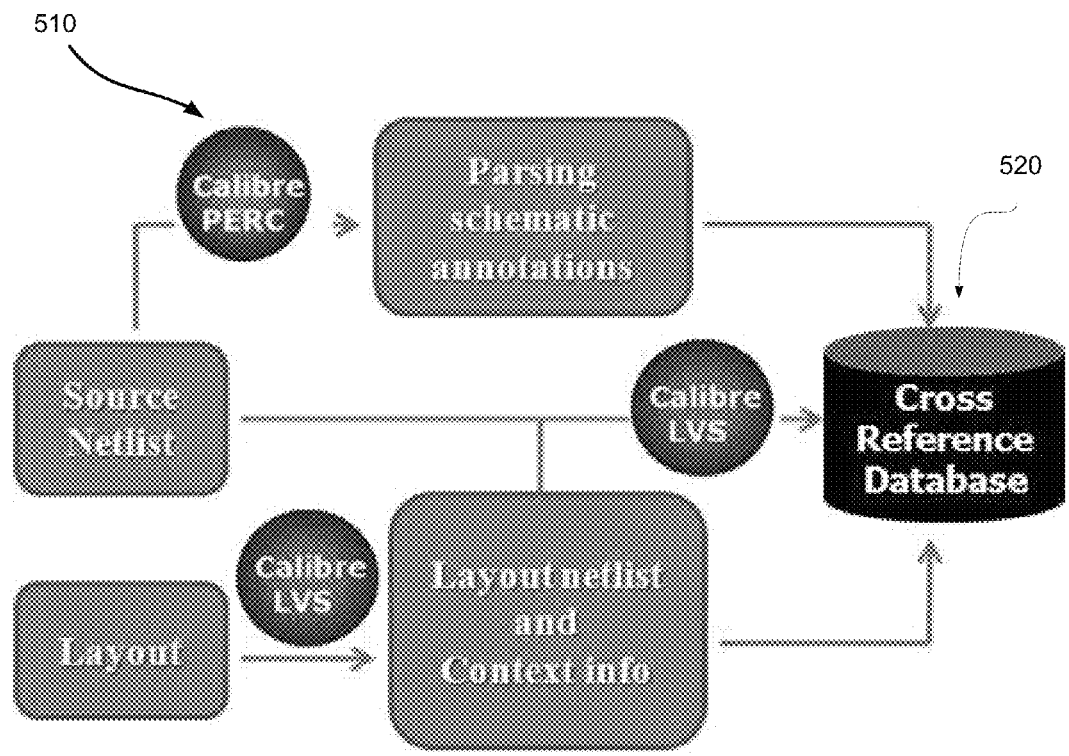
FIG. 5 illustrates a method that can be employed to obtain information for an electrical DFM tool to process according to various embodiments of the invention.

Some information received by the electric DFM tool 300 may be obtained by a method shown in FIG. 5, assuming that the front-end designer places design electrical constraints in the form of annotations on the schematic netlist that was extracted from an electrical analysis stage. These annotations inform the physical layout engineers that the electrical behavior of certain devices and nets should be preserved after the physical layout implementation. After a layout design is generated, this information is processed to generate text and marker layers on the layout design to mark the annotated devices/nets. The type of annotation, together with the text and marker layer numbers, may be used by the electric DFM tool 300 to generate a minimized SPICE netlist. The process may comprise three steps: parsing the schematic annotations, linking the schematic database to the layout database and identifying the annotated devices and nets on the layout database.

The parsing operation analyzes the annotations placed in the schematic netlist (such as electrical variation constraints or layout recommendations) and correlates each device/net with its corresponding design constraint check. A programmable electrical rule check (PERC) tool, such as those in the Calibre family available from Mentor Graphics Corporation of Wilsonville, Oreg. (510 in FIG. 5), may be employed to perform the operation. The results may be reported in a separate output file containing each device or net and its associated annotation.

The linking operation links the parsed device or net to its corresponding mate in the layout. The main link between the schematic netlist and the layout is the layout versus schematic (LVS) deck that is used to perform the LVS comparison. Once the layout is LVS-clean, an LVS database 520 is generated. This database 520 contains information that specifies the device and net properties on both the schematic and the layout databases. In addition, information about the connectivity and the layer properties of each layer on the layout is available in this database 520.

The LVS output database 520 may comprise two main files: an instance cross-reference file and a net cross-reference file. The former is a text file that contains matched instances between the schematic and the layout, representing for each instance its name, properties, and coordinates on both the schematic and layout databases. The latter is a text file that contains matched nets between schematic and layout, representing for each net its name, properties, and coordinates on both the schematic and layout databases. These two files are used in the proposed flow to cross-reference the schematic and the layout designs. For this step to run correctly, the design should be LVS-clean, ensuring the generated cross-referencing files correctly map to the equivalent devices.

The third operation uses the coordinates obtained from the cross-referencing files to place a text layer on each appropriate device. In this step, a software script is used to organize and apply the data obtained from the first two steps to generate the required text and marker layers. Because a net can span many layers, one pair of coordinates may not be enough to mark a complete net. For the net checks, the net coordinates used in the LVS database to mark the net are extracted. When the device/net annotation calls for an electrical simulation, the associated text and marker layers are passed, along with a procedure that generates the required SPICE testcase. An example of a pseudo code description of the above process can be found in FIG. 3 of an article by Haitham Eissa, et al., "Parametric DFM solution for analog circuits: electrical-driven hotspot detection, analysis, and correction flow," IEEE Transactions on Very Large Scale Integration (VLSI) Systems, 2012, which is incorporated herein by reference.

Figure 6A:
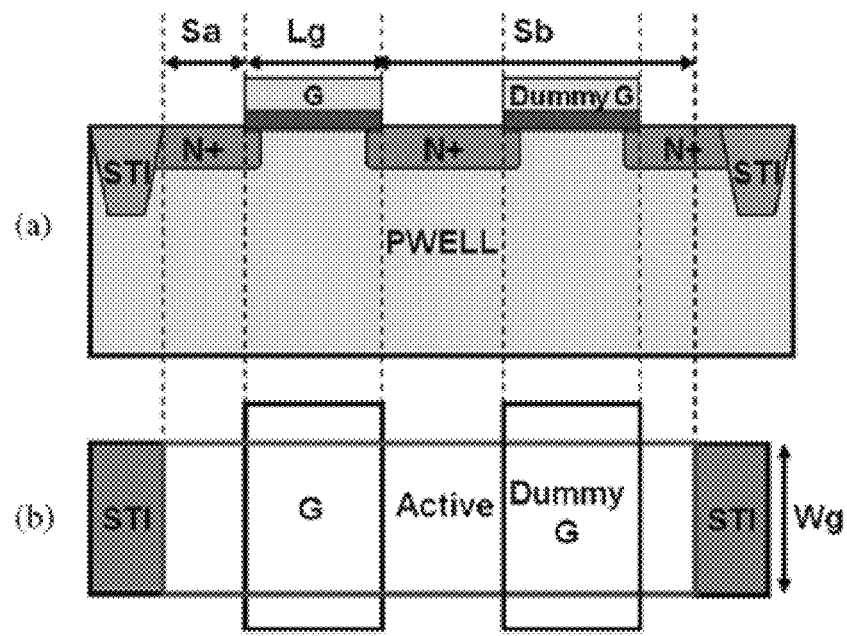
FIG. 6A illustrates two layout parameters of a transistor related to shallow trench isolation effects.
Figure 6B:
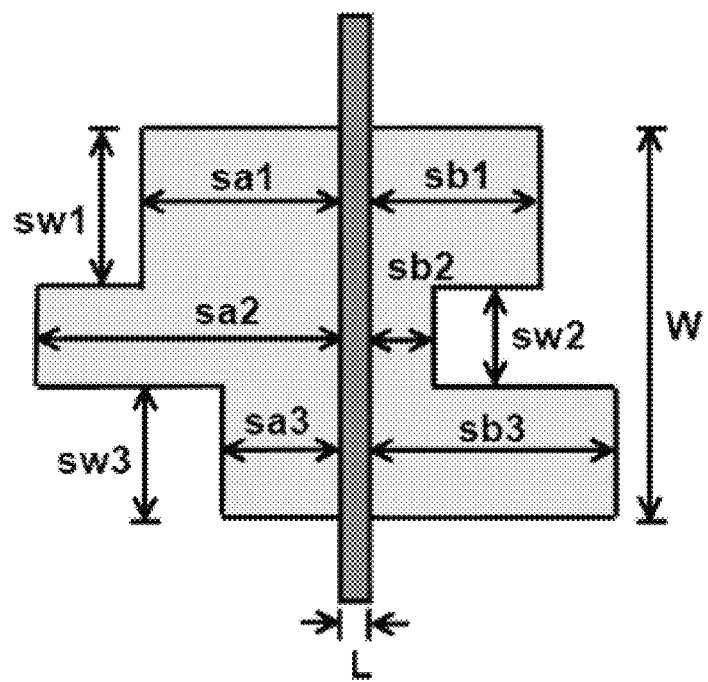
FIG. 6B illustrates layout parameters of a transistor related to shallow trench isolation and proximity effects.

After the design and constraint information is received by the electric DFM tool 300, the electrical hotspot detection unit 320, in operation 420, extracts layout parameters for the device instances associated with the electrical constraints. Various layout parameters may be extracted depending upon the nature of the electrical constraints. If an electrical constraint is related to variations caused by mechanical stresses, context-aware stress parameters may be extracted. The BSIM4 model, described in MOSFET Modeling and BSIM User Guide, Y. Cheng and C. Hu, Norwell, Mass.: Kluwer, 1999, which is incorporated herein by reference, may be used to compute the mechanical STI stress effect in the direction of channel length based on parameters Sa and Sb. These two layout parameters, illustrated in FIG. 6A, represent the distance from the gate to the edge of the active diffusion on either side of the device. Other STI stress parameters and well proximity parameters may be introduced to describe the active area region (such as Sai, Sbi, and Swi), as illustrated in FIG. 6B.

If an electrical constraint is related to variations caused by lithography effects, lithography-aware device dimension parameters may be extracted by the electrical hotspot detection unit 320. The non-rectangular gate profile may be sliced into sections with the same width, but different lengths, as illustrated in FIG. 6B. Total current for a given shape of gate can be approximated as the integration of current due to all the slices along the width direction. For a given gate voltage, this can be mapped onto a transistor of single equivalent length Leq and equivalent width Weq. The variations of length Leq and equivalent width Weq caused by the lithography effects may be obtained by a silicon simulation-based method, as described in an article by R. Salem, H. AbdelGhany, and M. Anis, "An automated methodology for implementing a DFM-aware standard cell library under process window and context variations," in Proc. IEEE 8th Int. NEWCAS Conf., June 2010, pp. 21-24, which is incorporated herein by reference. Alternatively or additionally, a lookup table provided by semiconductor manufacturers may be employed.

Next, in operation 430, the electrical hotspot detection unit 320 computes electrical parameter variations for the device instances based on the extracted layout parameters to identify one or more electrical hotspots in the layout design. The following discusses three different approaches for the electrical parameter variation computation.

The first approach use device model equations to calculate the variations such as those in Vth, mobility, and device dimensions for transistors. The results may then be passed to a lookup table containing a list of pre-simulated values of Idsat as a function of Vth, mobility, and device dimensions. While this approach avoids time-consuming simulations, there may be an accuracy tradeoff depending on the lookup table database.

The second approach first generates a minimized transistor-level netlist for each device with electrical constraints in the design. A one-device simulator may then be used to simulate single devices by defining different voltage nodes on the transistor. By defining the source-gate voltage, source-drain voltage, and drain-gate voltage, the simulator will calculate the Idsat current flowing from drain to source, considering different width and length values. Also, optimization may be performed and a certain width and length for the transistor at certain given Idsat current may be recommended. The one-device netlist is updated with process-aware parameters, and a SPICE simulation is then performed.

For small analog circuits, a full circuit simulation can be used. Afterwards, variations in percentage for absolute and matched devices are calculated.

The above three approaches are just examples of the electrical parameter variation computation that may be employed by the electrical hotspot detection unit 320. It would be appreciated by a person of ordinary skill in the art that variations and/or combinations of these approaches may be adopted by some embodiments of the invention.

To identify electrical hotspots, the electrical hotspot detection unit 320 may compare the original electrical behavior against the results obtained based on the extracted device parameters. If a device violates the user-defined electrical constraints, it may be highlighted as an electrical hotspot device. Below is an example of the output that the electrical hotspot detection unit 320 may provide. In the example, a list of the current variations in each device in the design is followed by a list of devices that violated the designer constraints.

Device Reports:
1) Id variation in device M12: −7.90739272034%;
2) Id variation in device M60: −27.6970011684%;
3) Id variation in device M36: 1.93942159603%;
4) Id variation in device M40: 2.69841174383%.

Device Violations:
1) violation: M12 absolute Id variation=7.90739272034%>5%;
2) violation: M60 absolute Id variation=27.6970011684%>10%.

Next, in operation 440, the sensitivity analysis unit 340 performs sensitivity analysis of the one or more electrical hotspots to generate repair hints. The sensitivity analysis may identify the source of the layout effects on integrated circuit performance. Transistor performance depends heavily on gate dimension. A small gate variation changes the channel length, creating a variation in a transistor's saturation current Idsat. As an example, stress generated by STI can alter the drive current of NMOS and PMOS transistors by up to 20% depending on the length of diffusion. As a consequence, the current of a transistor is not only related to the parameters of the gate such as the gate length L and width W, but also to the exact layout of the individual transistor. Similarly, significant sources of variations in gate dimension are exposure and etching variations in lithography.

The variation in a transistor's channel length has a direct impact on several electrical properties of a transistor; however, the most affected parameter is the Idsat, where the dependence of transistor current on channel length is increasingly non-linear. Idsat can be expressed as:

$$\frac{\delta I_{dsat}}{I_{dsat}} = \sum \left(\frac{\delta I_{dsat}}{\delta x_i} \frac{x_i}{I_{dsat}}\right) \frac{\delta x_i}{x_i} \quad (1)$$

where xi denotes the average of Vth, Cox, L and any other parameters in interest, while δxi denotes the deviation for each parameter. The average and standard deviation of the independent SPICE parameters can be extracted from the layout-aware SPICE netlist. The percentage of each component of the Idsat standard deviation is calculated. Based on this result, it can be determined if the Idsat of a specific device varies due to lithography effects (L,W), stress effects (Vth, mobility), or even CMP effects (Tox).

As stress effects are one of the main causes of electrical variations in analog and mixed-signal designs, equation (1) can be further applied to stress-related parameters. The width of well proximity and STI effects may induce mechanical stresses on the transistor channel, causing electrical and timing changes in the circuit performance. STI in the CMOS process induces mechanical stresses on the transistor channel. These mechanical stresses alter the transistor channel mobility μ and voltage threshold Vth, causing deviations in the electrical performance of the transistors, and subsequently in the circuit target specifications. Similarly, the well proximity effects can cause changes in the doping profile of the transistors, causing changes in the μ and Vth as well. These physical layout effects have a high impact on sensitive analog designs, such as current mirrors, differential pairs, amplifiers, and others, causing circuit mismatches, dc current offsets, and deviations from their original target specifications in the schematics. Hence, the electrical SPICE simulation of a schematic-level netlist can perform differently when in a real design environment.

The following are the Vth equation changes due to stress effects may be modeled as:

$$VTH0 = VTH0_{original} + \frac{KTH0}{K_{stress\_vth0}} \times (\text{Inv\_sa} + \text{Inv\_sb} - \text{Inv\_sa}_{ref} - \text{Inv\_sb}_{ref}). \quad (2)$$

The variation in Vth can then be calculated as:

$$\Delta VTH = \frac{KTH0}{K_{stress\_vth0}} \times (\text{Inv\_sa} + \text{Inv\_sb} - \text{Inv\_sa}_{ref} - \text{Inv\_sb}_{ref}). \quad (3)$$

Assuming that mobility relative change is proportional to stress distribution, the mobility relative change is described as:

$$\Delta \mu = \frac{KU0}{K_{stress\_u0}} \times (\text{Inv\_sa} + \text{Inv\_sb}). \quad (4)$$

Equations (2)-(4) are dependent on two different kinds of parameters:
1) Layout geometrical parameters, such as Inv_sa and Inv_sb, where $$\text{Inv\_sa} = \frac{1}{S_A + 0.5 \times L_{drawn}} \quad (5)$$

$$\text{Inv\_sb} = \frac{1}{S_B + 0.5 \times L_{drawn}}. \quad (6)$$

2) Process model technology parameters, such as KTH0, KU0, Kstress_u0, and Kstress_vth0.

The layout geometrical parameters may be extracted as noted above, and the process technology parameters are available as constants in the SPICE model cards of the target IC technology.

The saturation current is one of the main components in analog designs, and it is highly dependent on μ, Vth, and saturation velocity. The following equations represent changes in Idsat (using the long channel Idsat equations for simplicity) due to stress effects on Vth and mobility:

$$I_{dsat} = \frac{1}{2} \mu o C_{ox} \frac{W}{L} \times (V_{gs} - V_{th})^2. \quad (7)$$

Using equations (1) and (7), the variation in Idsat is expressed as:

$$\delta I_{dsat} = \frac{\delta I_{dsat}}{\delta \mu_o} \delta \mu_o + \frac{\delta I_{dsat}}{\delta V_{th}} \delta V_{th} \quad (8)$$

where $$\frac{\delta I_{dsat}}{\delta \mu_o} = \frac{1}{2} C_{ox} \frac{W}{L} \times (V_{gs} - V_{th})^2 \quad (9)$$

$$\frac{\delta I_{dsat}}{\delta V_{th}} = -\mu_o C_{ox} \frac{W}{L} \times (V_{gs} - V_{th}) \quad (10)$$

and δVth is defined in equation (3) and δμo is defined in equation (4). In addition, the schematic designers already have the operating point for all nodes of their circuit, including transistor gate-source voltage (Vgs) and transistor drain-source voltage (Vds). Therefore, the schematic designers can pass transistor voltages and any other required electrical constraints similar to the layout constraints through the intent-driven design engine. Applying these parameters to the target electrical equations provides the layout designer approximate values for electrical changes due to layout proximity effects. This analysis does not require a simulator on the layout side. For advanced technologies, the short channel Idsat equation may be used in the sensitivity analysis.

For devices that experience major stress effects, the sensitivity analysis may be further applied to determine the proper geometrical changes needed to minimize the stress effects. The diffusion edges of the examined device are increased in steps, without violating DRC constraints. Each time the diffusion edge is changed, multiple parameters in the transistor are impacted, [such as area AD, AS, PS, PD, squares of drain diffusion (NRD), and squares of source diffusion, as well as the stress and well proximity parameters (Sa, Sb, Sai, Sbi, and Swi)]. For each of these changes, the transistor model parameters in the SPICE netlist are updated, and electrical simulation runs are performed to obtain the variation change in Idsat. The modified diffusion edges value that corresponds to the minimum change in Idsat may be identified as the fixing hint that will be used in the e-hotspot correction engine.

Next, in operation 450, the electrical hotspot correction unit 360 adjusts the layout design based on the repair hints generated in the previous operation. Various techniques may be employed by the electrical hotspot correction unit 360. In some embodiments of the invention, a so-called smart cost-function technique is adopted. This technique performs localized hotspot correction and uses two or more cost functions simultaneously. A minimum number of edges may be moved to preserve the original layout shape. Some selected edges may be processed as part of an optimization function to ensure both the design rule constraints and the inserted hints are applied to fix the hotspots. An electrical hotspot is an area in the layout that is characterized by having high stress, lithography issues, or in general, a parametric yield issue. To fix it, several changes in the physical layout may be needed. The challenge in correcting hotspots lies in resolving the hotspot dependencies while making the minimum change to the layout shape. Some design automation tools that may be employed provide a solution for multiple hotspots by proposing different locations for some edges, which changes the value of stress parameters and resolves the hotspot. The selected edges and their proposed locations can serve as repair hints.

ChameleonART is one of the design automation tools that employs one of the smart cost-functions for repairing hotspots. A discussion of the tool can be found in an article by S. Hammouda, et al., "Chameleon ART: a non-optimization based analog design migration framework," in Proc. Design Autom. Conf., 2006, pp. 885-888, which is incorporated herein by reference. This tool exploits design reuse to fulfill multiple functions, including:

1) netlist migration between a source and a target technology;
2) layout migration and compaction to a target technology;
3) hotspot correction.

As a layout compaction or correction engine, ChameleonART exploits design reuse compaction techniques to fulfill the migration and the correction efficiently. It fulfills its job by moving all the edges relative to each other, guided by either the target design rule constraints as spacing, or the specifically selected edges in the hint file. As a hotspot correction engine, ChameleonART moves only the hinted edges and all their dependencies (which are the edges vulnerable to creating DRC errors), while keeping the rest of the edges' locations unchanged. This can preserve the connectivity and layout shape while providing a clean target design from the point of DRC and LVS. Additionally, it preserves the PEX profile of routing paths, and ensures a very similar performance compared to the original layout.

Figure 7:
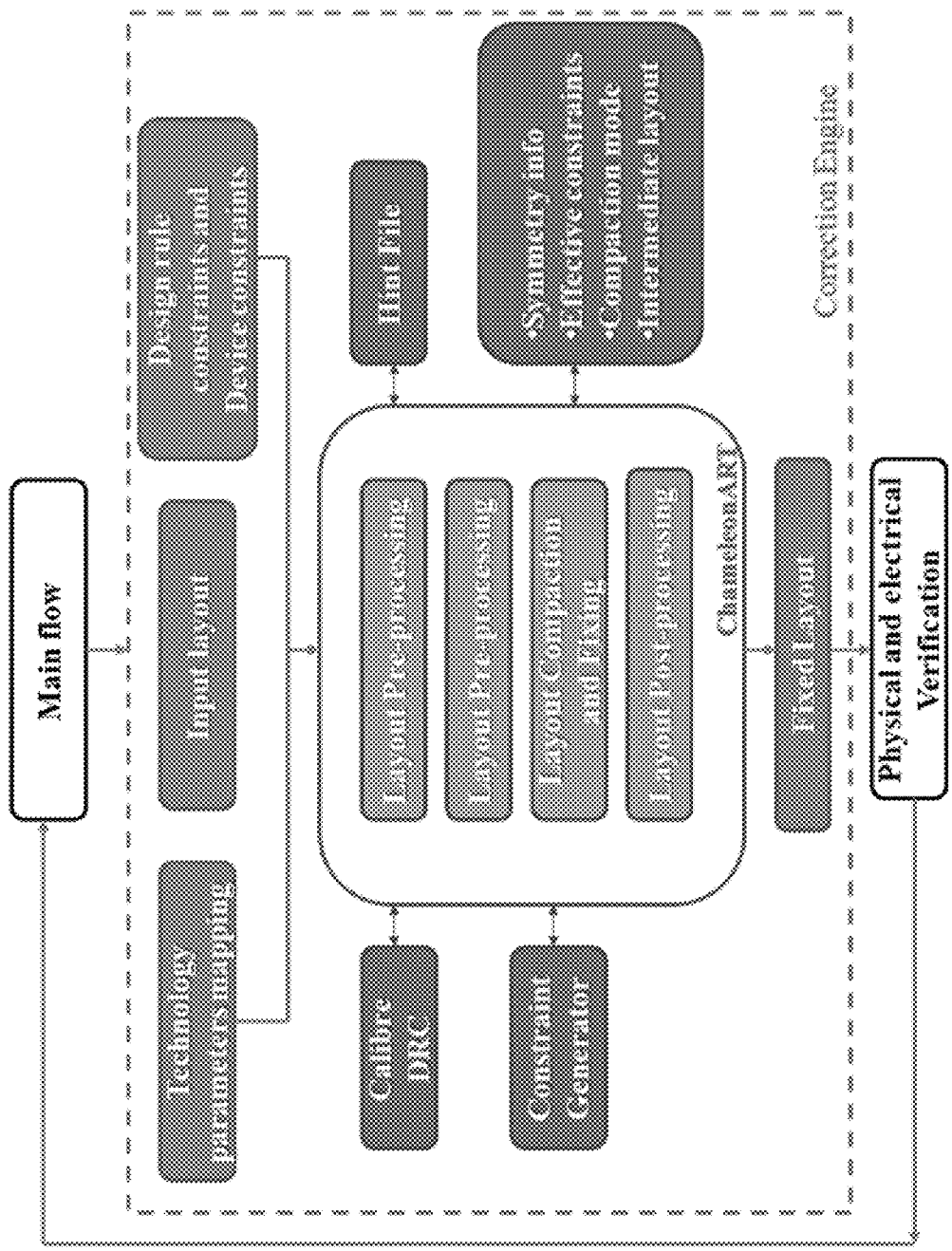
FIG. 7 illustrates a correction algorithm that may be employed by various embodiments of the invention.

A correction algorithm employed by ChameleonART is illustrated in FIG. 7. It includes:

1) The correction flow starts with the layout pre-processing stage. This pre-processing step helps to identify a correct relative coverage of layers, lower number of edges, and other techniques that ensure the correct and optimum number of constraints.
2) Next, the tool generates different types of constraints that guide the hotspot fixing process, design rule constraints that preserve the process design rules, the device dimensions, layout symmetry, and routing path constraints. There are many directives that must initially be set for increased efficiency and accuracy, such as the type of the cost function, the parameterized cell preservation algorithm, the routing handling algorithm, and user-defined constraints.
3) The last step is the layout migration or correction of the e-hotspot by localized layout compaction, decreasing the number of edges, constraints, or layers. The post-processing stage generates a suitable version for the physical verification phase.

An example of a pseudo code description of the above process can be found in FIG. 8 of the article by Haitham Eissa, et al., "Parametric DFM solution for analog circuits: electrical-driven hotspot detection, analysis, and correction flow," IEEE Transactions on Very Large Scale Integration (VLSI) Systems, 2012, which is incorporated herein by reference.

Lastly, in operation 460, the electric DFM tool 300 outputs the adjusted layout design. For example, the adjusted layout design may be stored in one or more computer-readable storage media (e.g., volatile or nonvolatile memory or storage), as shown with the output database 385 in FIG. 3.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. One or more non-transitory processor-readable storage media storing computer-executable instructions for causing one or more processors to perform a method, the method comprising:
   receiving information of a circuit design and a layout design for an integrated circuit, and information of electrical constraints, the circuit design comprising one or more analog circuits, the electrical constraints being associated with the electrical behavior of one or more analog electrical devices employed by the integrated circuit, analog device instances of the one or more analog electrical devices being linked to corresponding geometric features in the layout design:
   extracting layout parameters for the analog device instances;
   computing electrical parameter variations for the analog device instances based on the extracted layout parameters to identify one or more electrical hotspots in one or more of the analog device instances in the layout design;
   performing sensitivity analysis of the one or more electrical hotspots to generate repair hints, the sensitivity analysis including analysis of the effect of mechanical stress due to at least one of well proximity or shallow trench isolation on the electrical behavior of the one or more analog device instances, the repair hints including one or more diffusion edge modifications of the respective one or more analog device instances associated with the one or more electrical hotspots;
   adjusting the layout design based on the repair hints; and
   outputting the adjusted layout design.

2. The one or more processor-readable storage media recited in claim 1, wherein the circuit design comprises a transistor-level netlist.

3. The one or more processor-readable storage media recited in claim 1, wherein the layout parameters comprise one or more of context-aware stress parameters and lithography-aware dimension parameters.

4. The one or more processor-readable storage media recited in claim 1, wherein the computing comprises:
   using device model equations for deriving values of analog electrical device parameters.

5. The one or more processor-readable storage media recited in claim 4, wherein the analog electrical device parameters comprise one or more of saturation current, channel mobility, threshold voltage, channel length, channel width, SA parameter, and SB parameter.

6. The one or more processor-readable storage media recited in claim 1, wherein the computing comprises:
   using a simulation-based technique for deriving values of analog electrical device parameters.

7. The one or more processor-readable storage media recited in claim 6, wherein the using comprises:

extracting a minimized transistor-level netlist from a transistor-level netlist of the circuit design based on information of the analog device instances; and simulating the minimized transistor-level netlist.

8. The one or more processor-readable storage media recited in claim 6, wherein the using comprises:

simulating the circuit design.

9. The one or more processor-readable storage media recited in claim 6, wherein the analog electrical device parameters comprise one or more of saturation current, channel mobility, threshold voltage, channel length, channel width, SA parameter, and SB parameter.

10. The one or more processor-readable storage media recited in claim 1, wherein the sensitivity analysis further comprises lithography variation effect analysis, layout proximity effect analysis, or any combinations thereof.

11. The one or more processor-readable storage media recited in claim 1, wherein the adjusting comprises:

using a smart cost-function technique to adjust the layout design.

12. The one or more processor-readable storage media recited in claim 1, wherein the one or more analog electrical devices comprise one or more analog designs selected from current mirrors, differential pairs, and amplifiers.

13. The method recited in claim 1, wherein the diffusion edge modifications correspond to a minimum change in saturation current of the one or more analog device instances.

14. A method of electrical hotspot detection and correction, comprising:

with a computer, receiving information of a circuit design and a layout design for an integrated circuit, and information of electrical constraints, the circuit design comprising one or more analog circuits, the electrical constraints being associated with the electrical behavior of one or more analog electrical devices employed by the integrated circuit, analog device instances of the one or more analog electrical devices being linked to corresponding geometric features in the layout design;

extracting layout parameters for the analog device instances;

computing electrical parameter variations for the analog device instances based on the extracted layout parameters to identify one or more electrical hotspots in one or more of the analog device instances in the layout design;

performing sensitivity analysis of the one or more electrical hotspots to generate repair hints, the sensitivity analysis including analysis of the effect of mechanical stress due to at least one of well proximity or shallow trench isolation on the electrical behavior of the one or more analog device instances, the repair hints including one or more diffusion edge modifications of the respective one or more analog device instances associated with the one or more electrical hotspots;

adjusting the layout design based on the repair hints; and outputting the adjusted layout design.

15. The method recited in claim 14, wherein the circuit design comprises a transistor-level netlist.

16. The method recited in claim 14, wherein the layout parameters comprise one or more of context-aware stress parameters and lithography-aware dimension parameters.

17. The method recited in claim 14, wherein the computing comprises:

using device model equations for deriving values of analog electrical device parameters.

18. The method recited in claim 17, wherein the analog electrical device parameters comprise one or more of saturation current, channel mobility, threshold voltage, channel length, channel width, SA parameter, and SB parameter.

19. The method recited in claim 14, wherein the computing comprises:

using a simulation-based technique for deriving values of analog electrical device parameters.

20. The method recited in claim 19, wherein the using comprises:

extracting a minimized transistor-level netlist from a transistor-level netlist of the circuit design based on information of the analog device instances; and simulating the minimized transistor-level netlist.

21. The method recited in claim 19, wherein the using comprises:

simulating the circuit design.

22. The method recited in claim 19, wherein the analog electrical device parameters comprise one or more of saturation current, channel mobility, threshold voltage, channel length, channel width, SA parameter, and SB parameter.

23. The method recited in claim 14, wherein the sensitivity analysis further comprises lithography variation effect analysis, layout proximity effect analysis, or any combinations thereof.

24. The method recited in claim 14, wherein the adjusting comprises:

using a smart cost-function technique to adjust the layout design.

25. The method recited in claim 14, wherein the one or more analog electrical devices comprise one or more analog designs selected from current mirrors, differential pairs, and amplifiers.

26. The method recited in claim 14, wherein the diffusion edge modifications correspond to a minimum change in saturation current of the one or more analog device instances.

27. One or more non-transitory processor-readable storage media storing computer-executable instructions for causing one or more processors to perform a method, the method comprising:

receiving information of a circuit design and a layout design for an integrated circuit, and information of user-defined electrical constraints, the circuit design comprising one or more analog circuits, the user-defined electrical constraints being associated with the electrical behavior of one or more analog electrical devices employed by the integrated circuit, analog device instances of the one or more analog electrical devices being linked to corresponding geometric features in the layout design;

extracting layout parameters for the analog device instances;

computing electrical parameter variations for the analog device instances based on the extracted layout parameters and the user-defined electrical constraints to identify one or more electrical hotspots in one or more of the analog device instances in the layout design;

performing sensitivity analysis of the one or more electrical hotspots to generate repair hints, the sensitivity analysis including analysis of the effect of mechanical stress due to at least one of well proximity or shallow trench isolation on the electrical behavior of the one or more analog device instances, the repair hints being configured to bring the electrical behavior of the analog device instances within the user-defined electrical constraints while reducing changes to the layout design, the repair hints including one or more diffusion edge modifications of the respective one or more analog device instances associated with the one or more electrical hotspots;

adjusting the layout design based on the repair hints; and outputting the adjusted layout design.

28. The one or more processor-readable storage media recited in claim 27, wherein the diffusion edge modifications correspond to a minimum change in saturation current of the one or more analog device instances.

* * * * *